United States Patent [19]
Nicholas

[11] Patent Number: 5,002,367
[45] Date of Patent: Mar. 26, 1991

[54] MULTI-LEVEL CIRCUITS, METHODS FOR THEIR FABRICATION, AND DISPLAY DEVICES INCORPORATING SUCH CIRCUITS

[75] Inventor: Keith H. Nicholas, Reigate, England

[73] Assignee: U. S. Philips Corporation, New York, N.Y.

[21] Appl. No.: 268,315

[22] Filed: Nov. 7, 1988

[30] Foreign Application Priority Data

Nov. 20, 1987 [GB] United Kingdom ............... 8727248

[51] Int. Cl.$^5$ .................. H05K 1/02; G02F 1/333
[52] U.S. Cl. .................... 350/333; 174/261; 430/313; 430/318; 29/847
[58] Field of Search .............. 430/318, 319, 20, 313; 174/68.5, 117 PC, 261, 260; 29/847; 350/336, 333

[56] References Cited

U.S. PATENT DOCUMENTS 4,732,830 3/1988 DiSanto et al. ............... 430/20
4,917,467 4/1990 Chen et al. ................... 350/332

Primary Examiner—Jose G. Dees
Attorney, Agent, or Firm—John C. Fox

[57] ABSTRACT

In a multi-level circuit of the kind having two or more crossing conductive tracks (12, 14) on a substrate (16) separated at the region of the cross-over (21) by insulative material (20), for example for use in an active matrix display device requiring sets of mutually orthogonal conductors on a substrate for addressing switching elements (71) adjacent the cross-over regions connected to picture element electrodes (70) also carried on the substrate, at least one of the crossing tracks (12,14) is divided at the cross-over region into a plurality of mutually spaced conductive paths (24–26) connected electrically in parallel with one another. In the event of an unwanted short occuring between the cross tracks due to a defect in the separating insulative material, the short is removed by applying a suitable voltage between the tracks causing one conductive path at the area of the short to blow as a fuse thereby disconnecting the short and leaving the one or more remaining paths to maintain electrical continuity in the track.

9 Claims, 4 Drawing Sheets

5,002,367

MULTI-LEVEL CIRCUITS, METHODS FOR THEIR FABRICATION, AND DISPLAY DEVICES INCORPORATING SUCH CIRCUITS

BACKGROUND OF THE INVENTION

This invention relates to a multi-level circuit of the kind having on a substrate at least one conductive track crossing over at least one other conductive track with insulative material therebetween at the cross-over region. The invention relates especially to a method of fabricating such a circuit and also to a display device incorporating the circuit.

A circuit of the aforementioned kind may be used in a variety of different products. For example, such a circuit is used in an active matrix-addressed electro-optic display device of the type in which a matrix array of columns and rows of picture elements is defined by opposing electrodes carried on respective substrates between which, for example, liquid crystal material is present. One substrate carries an electrode common to all picture elements while the other substrate carries an array of individual picture element electrodes each associated with a switching element, such as a thin film transistor (TFT). The switching elements are driven via sets of column and row conductors which cross one another. Scanning (gating) signals are applied to the row conductors sequentially so as to turn on the switching elements of each row in turn while data (e.g. video) signals are applied to the column conductors for transfer to the appropriate picture element electrodes via the switching elements.

The substrate carrying the sets of row and column conductors constitutes a multi-level circuit of the aforementioned kind. The circuit usually is formed by defining two sets of parallel conductive tracks on the substrate crossing at right angles to one another and separated at least at the regions of the cross-overs by insulative material. Apart from their cross-over regions, the conductors of each set lie generally in respective planes overlying one another and substantially parallel with the substrate surface.

This type of display device can be used to provide TV displays, and it will be appreciated that for this purpose a large number of picture elements, for example, 150,000, is required; and that a correspondingly large number of cross-overs between the row and column conductors is involved.

A problem commonly experienced in production of these circuits for matrix display devices is that a short may occur between a row conductor and a column conductor at their cross-over, mainly due to defects in the insulative separator. A cross-over short is a serious problem and can prove catastrophic as it may result in part or all of a column or row of picture elements being faulty. These cross-over shorts have, therefore, a significant effect on yields.

In an attempt to overcome this problem, it has been proposed that a technique such as laser scribing be used to cut through a conductor on either side of the cross-over fault, so as to isolate the cross-over electrically, and to connect both ends of the conductors to the drive circuit so that the remaining portions of the row or column concerned can still function. However, this is an expensive and time consuming process and it is necessary to identify the, or each, cross-over fault before remedial action can be taken.

OBJECT AND SUMMARY OF THE INVENTION

It is an object of the present invention to provide a multi-level circuit of the kind described which is suitable for use in a display device and in which cross-over shorts are removed in a more convenient manner.

It is another object of the present invention to provide a method of making a multi-level circuit in which, in the event of a short occuring at a cross-over, the effect of the cross-over fault can be removed while maintaining cross-over properties, that is, with the conductive tracks retaining electrical continuity through the cross-over region.

It is a further object of the present invention to provide a multi-level circuit in which cross-over faults are corrected in an automatic fashion.

According to a first aspect of the present invention there is provided a method of fabricating a multi-level circuit having on a substrate at least one conductive track, the method crossing over at least one other conductive track comprising forming on the substrate the crossing conductive tracks with insulative material therebetween at the cross-over region, characterised by the steps of; forming at least one of the conductive tracks at the cross-over region with a plurality of mutually separated conductive paths connected electrically in parallel with one another; and applying a predetermined voltage between the crossing conductive tracks sufficient to cause fusing of a conductive path in the event of a cross-over short existing between that conductive path and the other conductive track so as to open circuit that conductive path.

The invention results in the removal of the effects of a cross-over short in a convenient manner while at the same time maintaining electrical continuity of the conductors at the cross-over. Because the probability of a cross-over fault occuring is generally low and the physical size of the short fault in comparison with the size of the conductors would usually be small, then at the, or each, cross-over region between the conductive tracks it is likely that such a fault will exist between only one of the plurality of conductive paths and the other conductive track. In the event of a short occuring, electrical current passes through the conductive path containing the short and, as a result of a power dissipation in the short, the conductive path concerned is caused to fuse and form globules, by melting under the influence of heat generated, thus producing a gap in the path and effectively rendering the path circuit open. Because the remaining one or more conductive paths at the cross-over are physically separated from the shorting path they are unaffected by this fusing action and serve to maintain electrical continuity of the conductive track across the cross-over region.

With this method, cross-over shorts can be disconnected in an automatic fashion merely by applying a suitable voltage to the crossing conductive tracks and without the need to identify beforehand, firstly, whether a cross-over short exists, and secondly, in the situation where the circuit involves a plurality of cross-overs, the precise location of the, or each, cross-over fault. This fault correction capability is of considerable benefit in the production of circuits involving a large number of cross-overs as high yields can be obtained and, compared with the known technique of laser scribing, in a manner which is less time consuming, less expensive, and more suited to automation. In addition, because electrical continuity of the respective conductive tracks is maintained across the cross-over regions, the need to connect both ends of the conductive tracks to an associated drive circuit, as in the known technique, is avoided.

According to a second aspect of the present invention there is provided a multi-level circuit produced in accordance with the first aspect of the invention.

According to a further aspect of the present invention, there is provided an active matrix addressed electro-optical display device, for example a liquid crystal display device, which incorporates a multi-level circuit fabricated in accordance with the first aspect of the invention and comprising on a substrate first and second sets of mutually orthogonal conductive tracks which cross one another, the substrate further carrying picture element electrodes adjacent to the cross-over regions and a switching element connected between each picture element electrode and a respective one of the conductive tracks of each set.

Although particularly advantageous for use in a display device in overcoming problems caused by cross-over shorts, the circuit of the present invention may be used in other applications which necessarily involve crossing conductive tracks carried on a substrate. By way of example, the circuit could be used in solid state memory devices and matrix sensor devices such as CCDs.

In the case where the circuit comprises a plurality of conductive tracks constituting a first set which cross over a plurality of other tracks constituting a second set, so that each conductive track has a series of cross-over regions, then the application of the predetermined voltage between crossing conductive tracks of the two sets could entail current flow through one conductive track at more than one cross-over region if a cross-over fault exists. In other words, current could flow through conductive paths at cross-over regions other than, but in series with, the one at which a cross-over short exists. The conductive paths at other cross-over regions will not be caused to fuse, however, as, at each region, the current is shared by the plurality of conductive paths with each individual conductive path carrying current less than that required for fusing.

The materials used for the components of the circuit and the manner in which they are used can be various. There are many known suitable materials and compatible processes which will be apparent to persons skilled in the art.

Those portions of each conductive track other than at the, or each, cross-over region are preferably of substantially constant width. At the, or each, cross-over region the plurality of conductive paths of the one conductive track may be formed such as to occupy an area greater in width than the width of immediately adjacent portions of that conductive track with each path individually having a width, preferably constant, less than that of the immediately adjacent parts. Such a configuration could be achieved if, for example, conventional photolithographic definition techniques are employed in the formation of the conductive paths. While this would work satisfactorily, it will be appreciated that the number and the minimum individual width of the conductive paths provided at the or each cross-over region are limited. Accordingly, besides resulting in a large cross-over area, high electrical currents will also be needed to cause fusing where necessary although the fusing current required would be dependent also on the thickness and resistivity of the deposited layer from which the paths are defined.

In one preferred embodiment, therefore, the plurality of conductive paths provided in a conductive track at the, or each, cross-over region occupy an overall area whose width corresponds substantially with the width of adjacent portions of the conductive track. This may be achieved in practice by selective removal of material deposited to constitute the conductive track within the width of the track using, again, conventional photolithographic techniques so as to leave strips of conductive material forming the conductive paths.

With such a configuration, the density of cross-overs can be increased and the width of the conductive tracks reduced, assuming standard alignment accuracy techniques are employed.

In another preferred embodiment compatible with silicon processing technology which is applicable particularly to circuits for use in active matrix display devices, and in which comparatively narrow conductive paths are present, edge defining techniques are employed. Using high temperature processing narrow p-type doped silicon paths can be produced using a lateral diffusion and etching technique such as that described in British Patent Specifications Nos. 1477511 and 1477512. This technique may be used conveniently for forming conductive tracks from polysilicon on a quartz substrate for example. Alternatively narrow silicide conductive paths may be produced at lower temperatures by a different version of this lateral diffusion technique as described in Applied Physics Letters, 1985, Volume 47, page 700. This technique may be used for forming conductive tracks of polysilicon on a glass substrate for example. The aforementioned edge defining techniques make it possible both to obtain relatively fine conductive paths in the conductive tracks at cross-over regions and to reduce the area of the cross-over.

Of course, other known techniques for forming narrow conductive paths could be used instead. As a further example therefore, which is compatible with amorphous silicon technology, conductive paths of metal can be formed using a spacer technique in which a metal layer deposited over a dielectric surface on which upstanding dielectric spacers are formed is anisotropically etched to leave portions of the metal layer at the sidewalls of the spacers, these portions constituting metal strips.

BRIEF DESCRIPTION OF THE DRAWING

Embodiments of multi-level circuits, methods of their fabrication, and a display device incorporating such circuits in accordance with the invention will now be described, by way of example, with reference to the accompanying drawings, in which.

DESCRIPTION OF THE PREFERRED EMBODIMENTS

Figure 1:
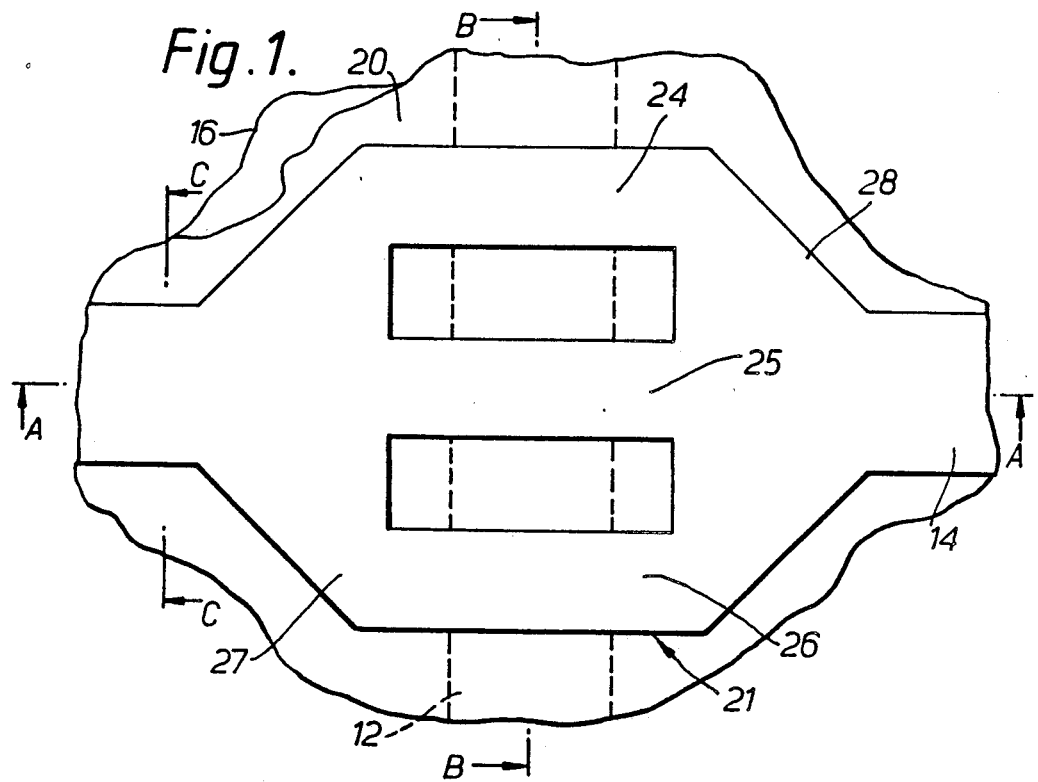
FIG. 1 is a plan view of part of one embodiment of a multi-level circuit in accordance with the invention showing a cross-over region thereof.
Figure 3:
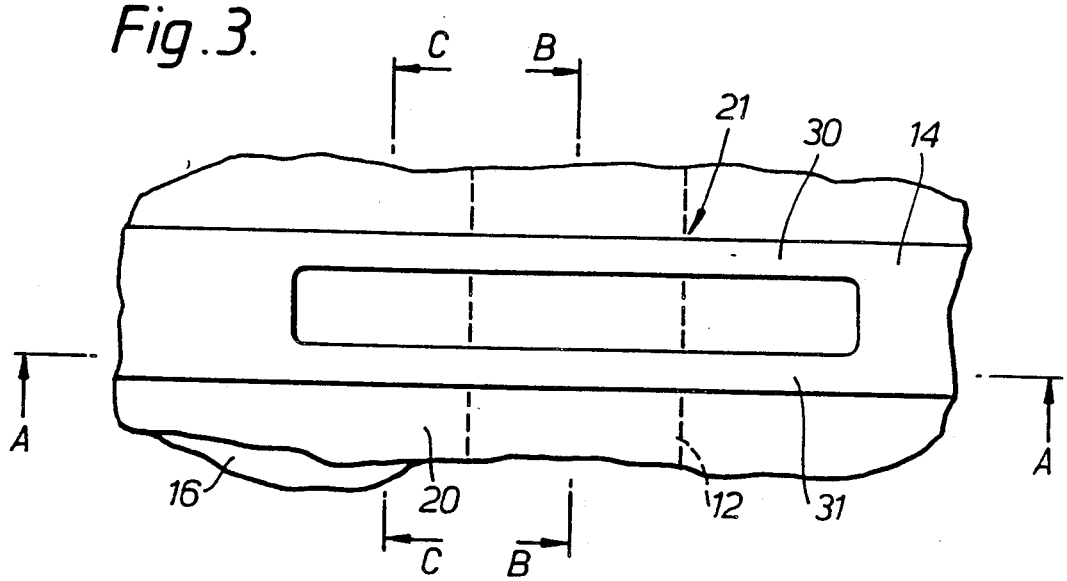
FIG. 3 is a plan view of part of another embodiment of multi-level circuit in accordance with the invention showing a cross-over region thereof.
Figure 5:
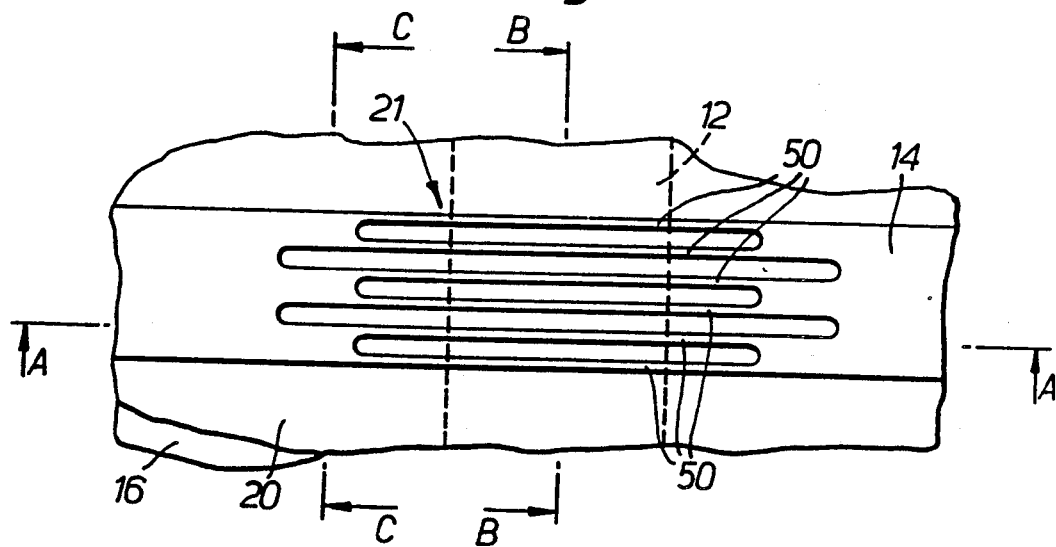
FIG. 5 is a plan view of part of a further embodiment of multi-level circuit in accordance with the invention showing a cross-over region thereof.

Each of the three embodiments of multi-level circuit shown partly in FIGS. 1, 3, and 5 comprises first and second sets of parallel conductive tracks extending substantially at right angles to one another with the second set overlying and crossing over the first set and forming an array of cross-overs. Referring to FIGS. 1, 3 and 5, each view shows in plan a typical cross-over between individual ones of the two sets of conductive tracks, these particular tracks being referenced 12 and 14.

Both sets of tracks are carried on a supporting substrate 16 and insulated electrically from one another forming a multi-level structure with the tracks at different levels with respect to the substrate. At least the surface portion of the substrate 16 on which the tracks are disposed comprises insulative material. In this respect, the substrate may be of insulative material such as glass, or of conductive or semiconductive material whose surface region is formed as an insulative material layer. Insulative material also separates the two sets of conductive tracks, either as a continuous layer extending completely over the area of the circuit or as locally defined insulative regions extending between the crossing conductive tracks at the area of each cross-over.

Figure 2A:
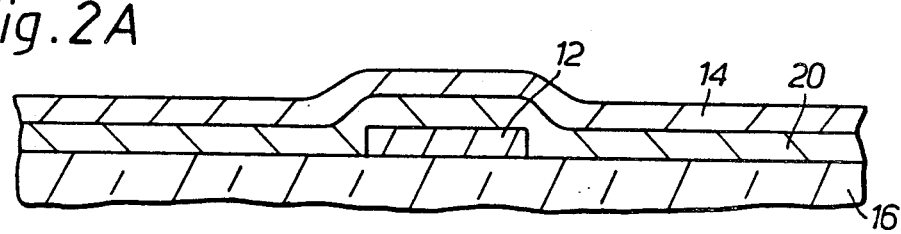
FIGS. 2A, 2B and 2C are cross-sectional views along the lines A—A, B—B and C—C respectively of the circuit of FIG. 1.
Figure 2B:
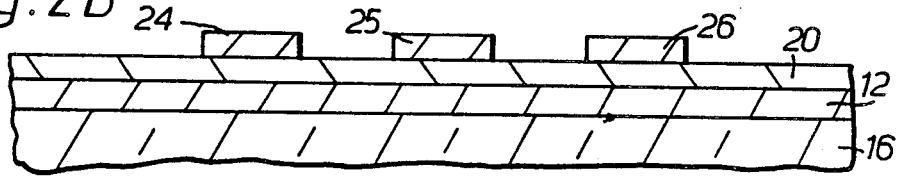
Figure 2C:
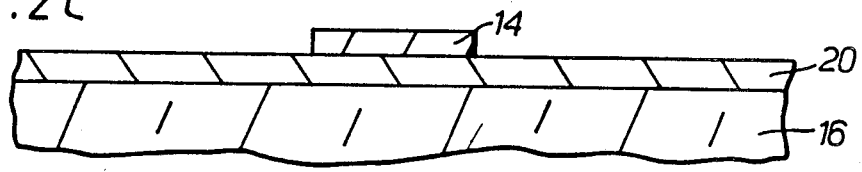

Referring now particularly to the embodiment shown in FIGS. 1 and 2, the circuit comprises a glass supporting substrate 16 upon whose surface the track 12 of the first set of tracks is deposited. The conductive track 12 is of flat strip form having substantially constant width and thickness over most of its length and comprises, for example, a metal such as aluminium, polysilicon, or indium tin oxide (ITO) defined in a conventional manner using a photolithographic technique. A continuous insulative layer 20 of, for example, silicon nitride or silicon oxide is deposited on the substrate to cover completely the track 12 and the surrounding surface of the substrate. The conductive track 14 is deposited on the surface of the insulative layer 20 so as to extend substantially at right angles to the track 12 and crosses over the track 12 at a cross-over region referenced generally at 21.

The track 14, which may also comprise polysilicon, ITO, or a metal such as aluminium is deposited in the same manner as track 12 and apart from the portion thereof extending across the cross-over region, is of substantially similar dimensions to the track 12. Typically, the tracks may be a few microns in width and less than a micron in thickness.

At the cross-over region 21, the conductive track 14 is wider overall and has two similarly sized and symmetrically arranged rectangular openings formed therein defining three strip-like conductive paths 24, 25 and 26 of similar length and width which extend parallel to one another over and beyond either side of the track 12. As shown, the paths 24, 25 and 26 are spaced apart in a direction transverse to the axis of track 14 and are connected to adjacent portions of the track 14 on either side of the cross-over region 21 by respective diverging lead-in portions 27 and 28 to provide three mutually spaced and electrically parallel branches. Individually the conductor paths have a substantially constant width which is less than that of the adjacent portions of track 14 and substantially constant thickness.

The shape of both the outer boundary of the track 14 at the cross-over region 21 and the rectangular openings determining the length, width and spacing of the individual conductive paths are defined during deposition of the track 14 simultaneously with definition of the remainder of the conductive track, and may be varied from the particular forms shown in the figures.

By virtue of the provision of multiple conductive paths in the track 14 at the cross-over region, the circuit is unlikely to suffer catastrophically in the event of a short occuring between the conductive tracks 12 and 14 at that region. In multi-level circuits generally, shorting between crossing conductive tracks can occasionally occur as a result of, for example, defects such as pin hole defects in the separating insulative layer. Obviously, the risk of a short increases in porportion with the number of cross-overs involved. Such defects are usually localised, being very small in size, and therefore, with regard to the form of cross-over shown in FIGS. 1 and 2, the effects would most probably be confined to one of the multiple conductive paths only.

Assuming that a short exists between the conductive path 24 and the underlying conductive track 12, correction can be achieved simply and conveniently by applying a voltage between the tracks 12 and 14. As a result, all electrical current will flow through the short leading to the creation of a hot spot at that point. By suitably choosing the level of voltage applied, for example in the order of tens of volts for the kind of tracks described, sufficient heat can be generated at the short to cause the conductive path 24 to blow in the nature of a fuse thereby rendering the path discontinuous and hence eliminating, by disconnection, the short between tracks 12 and 14. While the path 24 thus becomes open-circuit, electrical continuity of the conductive track 14 across the cross-over is maintained through the remaining parallel paths 25 and 26 so that the circuit can still function in the intended way satisfactorily.

The physical separation of the three conductive paths at the cross-over prevents the paths 25 and 26 being affected by heat generated at the region of the path 24.

Because the circuit comprises sets of crossing conductive tracks, the application of a voltage between respective ones of the tracks having a cross-over short could, depending on the location of the short, lead to electrical current flow through the multiple conductive paths of a track such as 14 at other cross-over locations in series with the one having the short. However, these conductive paths at each of the other cross-over locations will be unaffected by current flow since the current is carried by, and shared between, three conductive paths in parallel rather than being concentrated in just one.

For the array of cross-overs of the circuit, automatic disconnection of all existing shorts is achieved merely by applying a suitably chosen voltage between all tracks of the first set and all tracks of the second set. Electrical current will only flow in tracks with a short, or shorts, in them to cause the conductive path or paths concerned to blow open. Thus, it will be appreciated that the need to identify the particular location of the short or shorts becomes unnecessary. Consequently, the step of correcting for any shorts is greatly simplified and quickened. Furthermore, the need to connect independently portions of a track on both sides of a faulty cross-over to, for example, a common terminal of an associated supply circuit, is removed.

The number of spaced conductive paths formed in the upper set of conductive tracks at cross-over regions may be varied. While only two paths could be provided it is considered preferable to use at least three, and possibly, for example, six, individual paths for each cross-over. With a larger number of conductive paths at each crossing, the width of each path can be reduced accordingly, thereby enabling the use of lower applied voltages for disconnecting shorts. However, the use of conventional photolithographic processes to define the conductive paths imposes a limit on the minimum width of path possible. For cross-overs involving a large number of conductive paths therefore, the area of the cross-over region may need to be increased, which in turn limits the density of cross-overs achievable.

The conductive tracks of the first set, for example track 12, may similarly or alternatively be formed with multiple conductor paths, like paths 24, 25 and 26, at cross-over regions.

In the two further embodiments shown in FIGS. 3 and 4, and 5 and 6, alternative processing techniques are employed enabling finer conductive paths with smaller spacing to be produced in order to minimise cross-over area and hence allow increased densities.

The embodiments of FIGS. 3 and 4, and 5 and 6 respectively are similar in many respects to that described with reference to FIGS. 1 and 2 except for particular details of the cross-overs and the manner in which they are formed. For this reason, the same reference numerals are used to identify similar components and the following descriptions will be concerned primarily with the differences, it being understood that the manner in which short defects are disconnected will be the same as described previously.

Figure 4A:
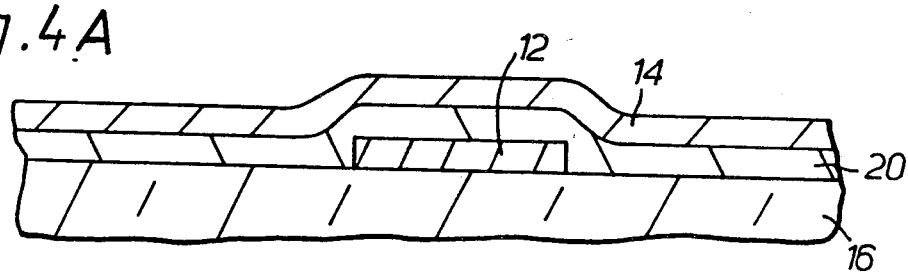
FIGS. 4A, 4B and 4C are cross-sectional views along the lines A—A, B—B and C—C respectively of the circuit of FIG. 3.
Figure 4B:
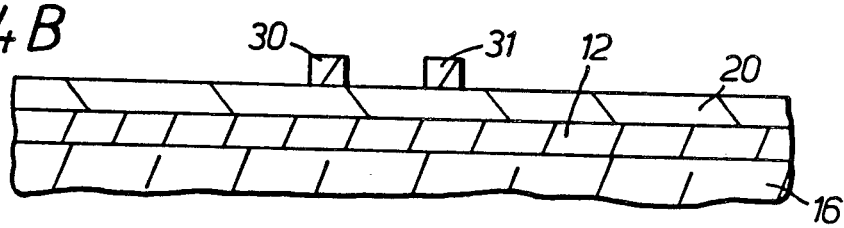
Figure 4C:
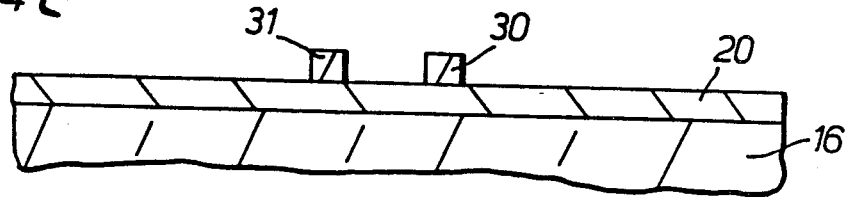

Referring to the embodiment of FIGS. 3 and 4, the width of the conductive track 14 is maintained substantially constant both over the cross-over region 21 and regions intermediate cross-overs. A centrally-located rectangular opening is formed at the cross-over region to define a pair of parallel strip-like substantially constant width, conductive paths 30 and 31 of substantially identical shape and dimensions. This configuration is possible using a photolithographic process offering high accuracy alignment. A second opening arranged with the aforementioned opening symmetrically within the track width may also be provided, giving three parallel and spaced conductive paths.

The materials employed may be the same as those described with regard to the embodiment of FIGS. 1 and 2.

Figure 6A:
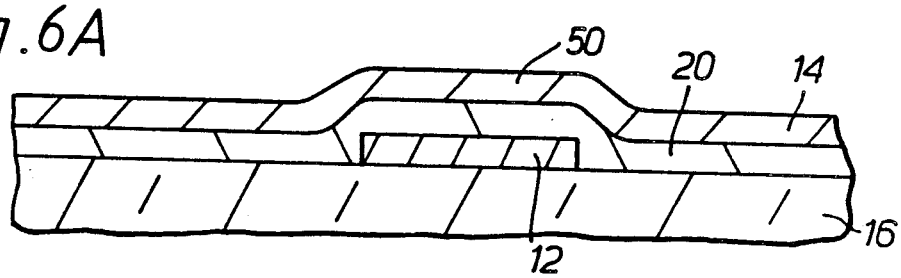
FIGS. 6A, 6B and 6C are cross-sectional views along the lines A—A, B—B, C—C respectively of the circuit of FIG. 5.
Figure 6B:
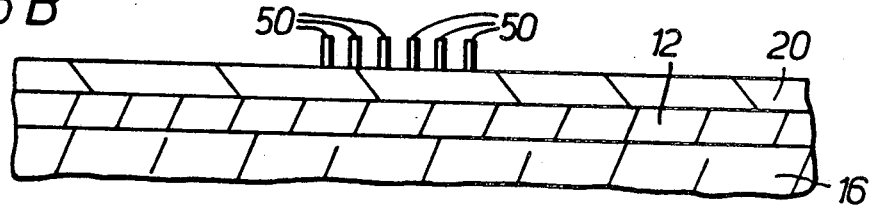
Figure 6C:
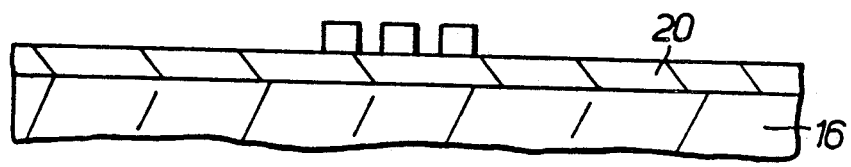

With regard to FIGS. 5 and 6, this embodiment uses fine conductive paths formed by an edge defining technique. In the particular example shown, six parallel and evenly-spaced conductive paths, 50, are provided extending across the cross-over region 21.

The fine conductive paths 50 can be fabricated by a number of different techniques and using different materials. The choice is dependent to some extent on processing temperatures involved while also the intended application of the circuit is taken into account. The circuits described herein are intended especially for use in an active matrix-addressed electro-optic display device, such as a LCD-TV, in which the circuit constitutes one substrate of the device carrying row and column addressing conductors together with picture element electrodes and associated switching elements which comprise TFTs formed using amorphous silicon or polysilicon on glass or polysilicon on quartz technologies.

In a comparatively low temperature process using amorphous silicon on glass technology, metal filaments or strips constituting the conductive paths 50 can be formed by a spacer technique.

In this technique, dielectric spacer strips are deposited on the surface of the insulative layer followed by an evaporated metal layer covering the strips and adjacent areas of the insulative layer. Then, by using an anistropic dry etch, the metal layer is gradually etched away until only portions thereof adjacent the sidewalls of the strips, where the metal layer is thicker, remain. These portions, following removal of the dielectric strips, constitute the conductive paths. In a variation of this technique, the metal layer may be covered by a further dielectric layer. This further dielectric layer is then etched until areas of the metal layer other than adjacent the sidewalls of the spacer strips where the further dielectric layer is thicker, are exposed. The exposed metal is then removed and then the dielectric materials so as to leave metal strips.

In a higher temperature process using polysilicon on glass technology involving processing temperatures greater than 500 degrees Celsius, fine conductive paths of silicide can be formed using a process similar to that described in Applied Physics Letters, 1985, Vol. 47, page 700, details of which are incorporated herein by reference.

In a yet higher temperature process using polysilicon on quartz technology involving processing temperatures greater than 700 degrees Celsius, fine conductive paths comprising p-type doped silicon can be fabricated by means of a lateral diffusion and etching technique such as that described in U.S. Pat. Nos. 4,124,933 and 4,287,660 details of which are incorporated herein by reference. Using this process, the two longer openings shown in FIG. 5 are formed simultaneously with the outer edges of the track 14. The three further, and shorter, openings are subsequently formed simultaneously.

Figure 7:
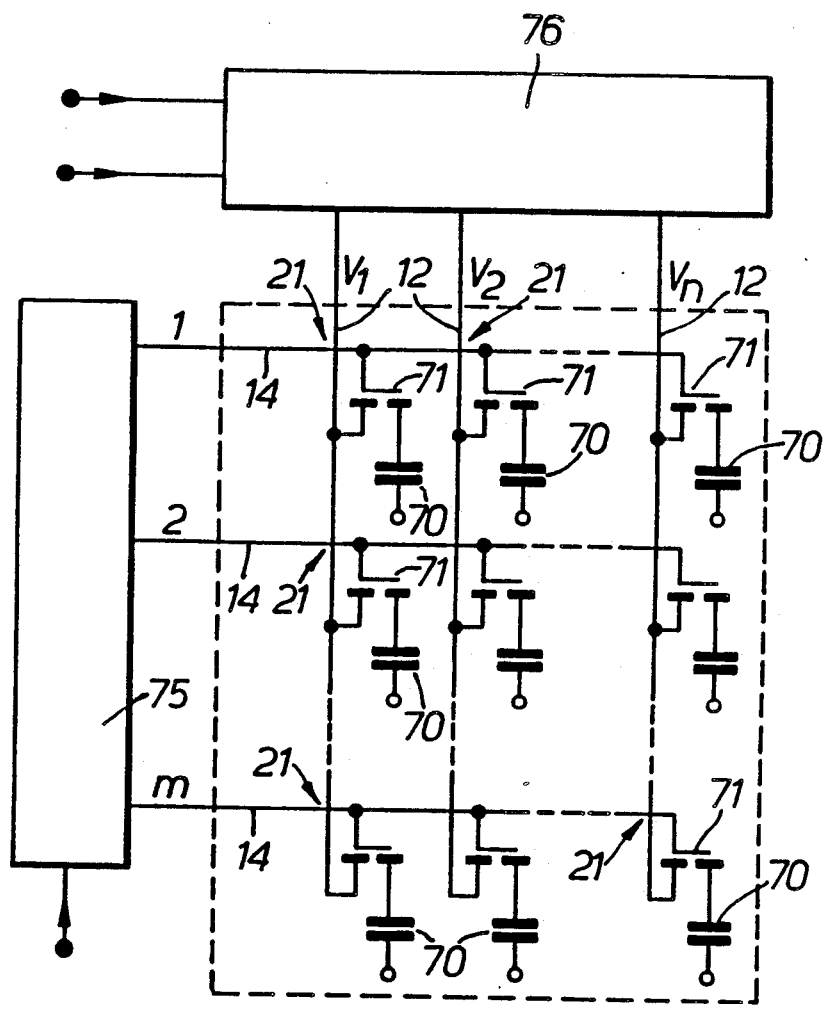
FIG. 7 shows diagrammatically the circuit of an active matrix addressed liquid crystal display device incorporating a multi-level circuit according to the invention.

FIG. 7 illustrates schematically the electrical circuit configuration of an active matrix addressed liquid crystal display device incorporating a multi-level circuit according to any one of the preceding described embodiments. Active matrix addressed liquid crystal display devices are generally well known and widely documented and as such will not be described herein in detail. Briefly, however, the device comprises two spaced substrates with liquid crystal material disposed therebetween and carrying electrodes which define a column and row array of picture elements, only a few of which are shown, referenced at 70. One substrate carries an electrode common to all picture elements whereas the other substrate carries an array of individual electrodes defining respective individual picture elements. In a typical display device intended for displaying TV pictures for example, there may be around 200,000 picture elements.

The substrate carrying the individual picture element electrodes further carries switching elements 71, in the form of TFTs, each of which is associated with, and connected to, a respective picture element 70, and also addressing conductors for supplying gating and data signals to the TFTs for controlling the voltage applied to the individual picture element electrodes.

This substrate and its addressing conductors comprises the multi-level circuit. The addressing conductors are arranged on the substrate, corresponding to substrate 16 in the above described embodiments, in rows and columns which cross one another, the position of the picture elements being determined by, and situated adjacent the cross-overs. The column conductors comprise the conductive tracks 12 and together constitute the aforementioned first set of conductive tracks. The row conductors comprise the conductive tracks 14 and together constitute the second set of conductive tracks.

The particular form of multi-level circuit employed depends on the technology used to fabricate the TFTs, for example amorphous silicon or polysilicon technology. As such the substrate may be of, for example, glass or quartz.

In another form of the device, the switching elements may comprise MOSFETs formed on the substrate 16 which for this purpose consists of a slice of single crystal silicon.

The sets of row and column conductors, the switching elements and the picture element electrodes on the substrate 16 are covered by one or more insulative layers extending continuously over the area of the array in a known manner.

The gates of all switching elements in a row are connected to a respective one of the row conductors 14 and the sources of all switching elements in a column are connected to a respective one of the column conductors 12. The picture elements are addressed on a row at a time basis by sequentially scanning conductors 14 using a drive circuit 75 and with data signals being supplied appropriately by a drive circuit 76 to the switching elements via the conductors 12 for transfer to the picture element electrodes contemporaneously with row addressing so as to build up a picture.

I claim:

1. A multi-level circuit having on a substrate at least one conductive track crossing over at least one other conductive track, with insulative material therebetween at the cross-over region, at least one of the conductive tracks defining at least one aperture at the cross-over region, characterized in that the aperture extends beyond either side of the other track, to form at least two conductive paths in the one conductive track extending beyond either side of the other track, whereby upon application of an appropriate voltage across the tracks, a short between a path of the one track and the other track will cause an open circuit in that path.

2. An active matrix electro-optical display device incorporating a multi-level circuit of claim 1, the circuit comprising first and second sets of mutually orthogonal conductive tracks which cross one another, the substrate further carrying picture element electrodes adjacent to the cross-over regions and a switching element connected between each picture element electrode and a respective one of the conductive tracks of each set.

3. A method of fabricating a multi-level circuit having on a substrate at least one conductive track crossing over at least one other conductive track, the method comprising forming on the substrate the crossing conductive tracks with insulative material therebetween at the cross-over region, characterised by the steps of: forming at least one of the conductive tracks at the cross-over region with a plurality of mutually separated conductive paths connected electrically in parallel with one another; and applying a predetermined voltage between the crossing conductive tracks sufficient to cause fusing of a conductive path in the event of a cross-over short existing between that conductive path and the other conductive track so as to open circuit that conductive path.

4. A method according to claim 3, characterized in that the plurality of conductive paths of the one conductive track are formed at the cross-over region so as to occupy an area substantially the same in width as parts of the track immediately adjacent the cross-over region with each path individually having a width less than that of the immediately adjacent parts.

5. A method according to claim 3 or 4, characterised in that the plurality of conductive paths at the cross-over region are formed by selective removal of deposited material using a photolithographic process.

6. A method according to claim 3 or 4, characterised in that the plurality of conductive paths at the cross-over region are formed using an edge definition process.

7. A method according to claim 3 or 4, characterised in that the plurality of conductive paths are formed from doped silicon material by a lateral diffusion and etching process.

8. A method according to claim 3 or 4, characterised in that the plurality of conductive paths are formed from silicide material by a lateral diffusion and etching process.

9. A method according to claim 3, characterised in that the plurality of conductive paths of the one conductive track are formed by photolithographic definition at the cross-over region so as to occupy an area greater in width than the width of parts of the conductive track immediately adjacent the cross-over region with each path individually having a width less than that of the immediately adjacent parts.

* * * * *